(12) United States Patent
Bär et al.

(10) Patent No.: US 7,087,453 B2
(45) Date of Patent: Aug. 8, 2006

(54) METHOD AND DEVICE FOR THE PRODUCTION OF A SEMICONDUCTING AND/OR ELECTROLUMINESCENCE-DISPLAYING ORGANIC LAYERED STRUCTURE

(75) Inventors: K. O. Kai Bär, Bruckmühl (DE); Rainer Gaus, Bruckmühl (DE); Thorsten Hülsmann, Schechen (DE); Rolf Wirth, Bruckmühl (DE)

(73) Assignee: Advanced Photonics Technologies AG, Bruckmuhl (DE)

( * ) Notice: Subject to any disclaimer, the term of this patent is extended or adjusted under 35 U.S.C. 154(b) by 0 days.

(21) Appl. No.: 10/344,259

(22) PCT Filed: Jul. 23, 2001

(86) PCT No.: PCT/EP01/08491

§ 371 (c)(1),
(2), (4) Date: Jul. 21, 2004

(87) PCT Pub. No.: WO02/13285

PCT Pub. Date: Feb. 14, 2002

(65) Prior Publication Data

US 2004/0241901 A1 Dec. 2, 2004

(30) Foreign Application Priority Data

Aug. 9, 2000 (DE) ................................. 100 38 895

(51) Int. Cl.
| | |
|---|---|
| H01L 21/00 | (2006.01) |
| H01L 51/40 | (2006.01) |
| H01L 21/31 | (2006.01) |
| H01L 21/469 | (2006.01) |

(52) U.S. Cl. .................. 438/82; 438/99; 438/781; 257/40; 257/642

(58) Field of Classification Search .................. None
See application file for complete search history.

(56) References Cited

U.S. PATENT DOCUMENTS

| | | | | |
|---|---|---|---|---|
| 4,761,361 | A | * | 8/1988 | Ozaki et al. ................ 430/203 |
| 4,913,949 | A | * | 4/1990 | Steininger et al. ......... 428/64.9 |
| 5,154,808 | A | | 10/1992 | Miyasaka et al. |
| 5,709,974 | A | * | 1/1998 | Yuh et al. .................... 430/126 |
| 5,727,578 | A | | 3/1998 | Matthews |
| 5,895,692 | A | | 4/1999 | Shirasaki et al. |
| 6,060,826 | A | | 5/2000 | Ueda et al. |
| 6,103,436 | A | * | 8/2000 | Yanus et al. ............... 430/58.8 |
| 6,132,913 | A | * | 10/2000 | Fuller et al. ................ 430/591 |

FOREIGN PATENT DOCUMENTS

| | | |
|---|---|---|
| DE | 198 51 703 A1 | 5/2000 |
| EP | 0 132 248 | 1/1985 |
| EP | 0 652 243 A2 | 5/1995 |
| EP | 0 930 641 | 7/1999 |
| JP | 06-053132 | 2/1994 |
| WO | 99/19900 | 4/1999 |
| WO | 99/39373 | 8/1999 |

OTHER PUBLICATIONS

U. Kilian/Chr. Weber (Editor): "Lexicon of Physics in 6 Volumes", vol. 3, 1999, Spektrum Akademischer Verlag (publishers), Heidelberg, p. 127f.—Infrarot.

"Brockhaus Encyclopedia", 19th edition, vol. 10, 1989, F. A. Brockhaus GmbH Mannheim; p. 499-501—Infrared—Infrared dryer.

Kupfer, "Trockenschrankverfahren, Infrarot —Und mikrowellentrocknung Als Referenzverfahren Zur Bestimmung Der Materialfeuchte Drying Oven Method, Infared —And Microwave Drying As Reference Methods for Determination of Material Moisture", Technisches Messen TM, vol. 66(6):227-237, (1999).

Patent Abstracts of Japan, Nakazawa, "Drying Method for Organic Photosensitive Body", vol. 011, No. 137, (P-572), Aug. 12, 1986, JP 61 277958.

Scott, et al., "Degradation and Failure of MEH-PPV Light-Emitting Diodes", Journal of Applied Physics, American Institute of Physics, vol. 79(5):2745-2751, (1996).

Anon, "Infarot (IR) Und Ihre Industrielle Anwendung", Kautschuk und Gummi —Kunststoffe, vol. 36(10):899-901, (1983).

Yamashita et al., "Encapsulation of Organic Light-Emitting Diode Using Thermal Chemical-Vapour-Deposition Polymer Film", Journal of Physics D (Applied Physics), vol. 34(5):740-743, (2001).

* cited by examiner

*Primary Examiner*—Ngân V. Ngô
(74) *Attorney, Agent, or Firm*—Venable LLP; Robert Kinberg

(57) ABSTRACT

Method of manufacturing a semiconducting organic laminated structure, for use in an electronic circuit, in particular a logic and/or memory circuit, wherein a substrate is coated with a solution or dispersion containing a small proportion of an organic composite and having a certain wet-layer thickness, which by drying is converted into an organic thin layer with semiconducting properties that adheres to the substrate and has a dry-layer thickness substantially less than the wet-layer thickness, in particular by an order of magnitude or more, the drying being accomplished by brief irradiation with electromagnetic radiation that has its main effective component in the near-infrared range, in particular in the region between 0.8 and 1.5 μm.

26 Claims, No Drawings

METHOD AND DEVICE FOR THE PRODUCTION OF A SEMICONDUCTING AND/OR ELECTROLUMINESCENCE-DISPLAYING ORGANIC LAYERED STRUCTURE

This application is 317 of PCT application No. EP01/08491, filed Jul. 23, 2001.

The invention relates to a method of manufacturing a semiconducting and/or electroluminescent organic laminated structure, in particular according to the precharacterizing clause of claim 1 and/or 2, as well as an apparatus for implementing this method.

Electro-optical display units for electronic devices are at present constructed predominantly in the form of liquid crystal displays (LCD), which are at such a high level of technological development that they can be used to provide extremely economical, easily controllable and also adequately long-lived display units.

In addition to the LCD technology, however, there are a number of other principles for implementing electro-optical displays, which have already found practical applications. Among these, vacuum-fluorescence displays play an appreciable role in the least demanding range of applications, because of their extremely low costs. On the other hand, the high-quality plasma displays have captured a considerable fraction of the market related to large-format equipment, such as high-quality television sets. Where smaller formats are concerned, however, their resolution is limited because minimal pixel dimensions are required for physical and technical reasons.

For some years the phenomenon of organic electroluminescence has attracted the attention of those attempting to design new, economical display technologies with a broad range of applications. The relevant components are often termed "organic" light-emitting diodes (OLED). By now dozens of companies are engaged in the development of such displays, and substantial improvements in their photonic properties have been achieved, along with a considerable increase in life expectancy.

OLEDs are based on so-called "small" molecules or polymers, which are arranged in a very thin layer—or, in the case of "multilayer" OLEDS, in several thin layers superimposed on one another—supported on a substrate coated with a conductive, transparent film. In the course of previous development many substances having electroluminescent properties have been investigated, as well as a number of component configurations and possible technological implementations.

It has proved possible to apply the thin layers, firstly, by means of molecular beam epitaxy; secondly, solutions or dispersions containing a very small proportion of the chosen substance or composite of substances can be applied by a spinning-on procedure and subsequently dried to produce a solid organic thin layer. In both processes, in order to achieve a satisfactory working life of the display element being produced, contact with water or water vapor must be just as strictly prevented as is the case during subsequent operation. Therefore the substrate must be strictly free of all water-adsorbing substances and the finished display element must be encapsulated so as to be absolutely moisture-tight.

The methods used in the laboratory to construct layers, and the accompanying processes, are expensive and not very productive, so that it has not previously been possible to manufacture OLEDs while keeping the costs competitive with those for other displays.

Furthermore, in the course of previous work a number of the organic substances considered for use in OLEDs have been found to have distinct semiconductor properties when used in certain degrees of purity and certain laminar constellations, so that it seems possible in principle that they could be employed in electronic circuits for purposes other than display—in particular, in logical and/or memory circuitry. Such applications, however, appear to place considerably more stringent demands on the lamination and drying processes and on the exclusion of interfering factors.

The objective of the present invention is thus to create a method of this generic kind, as well as an apparatus for its implementation, that enables an organic laminated structure with electroluminescent or semiconducting properties to be manufactured with high productivity and low costs.

The methodological aspect of this objective is achieved primarily by a method with the characteristics given in claim 1 or 2 and also—according to relatively independent manifestations of the idea underlying the invention—by procedures with the characteristics given in claims 8 to 11. With respect to the apparatus, the objective is achieved by an apparatus with the characteristics given in claim 17.

The invention includes the fundamental idea of employing electromagnetic radiation with a substantial effective component in the near-infrared region, in particular in the wavelength region between 0.8 µm and 1.5 µm, for drying a fluid layer applied to the substrate in order to form an organic thin layer with semiconducting or electroluminescent properties. Relatively independently, it also includes the idea that the above-mentioned radiation in the near-infrared region (NIR radiation) is employed for accessory processes such as removing water-adsorbing substances from the substrate and/or drying photosensitive layers applied for the photolithographic structuring of the substrate, and/or for drying or inducing cross-linking in an adhesive substance used to encapsulate the organic thin layer(s).

According to a preferred embodiment of the invention, the solution or dispersion is made with an organic solvent that is especially easily volatilized under the influence of NIR radiation. This condition is met, for instance, by toluol, which is also suitable for this purpose with respect to other considerations.

As a substrate for the organic thin layer what is preferred—depending on the particular purpose for which the laminated structure is intended—is a thin ceramic plate or a thin (sufficiently to be flexible, for certain applications) glass plate. In principle the carrier can also be formed by a plastic film or plate, if it is sufficiently resistant to the diffusion of moisture. Such a property can, if necessary, be ensured by application of a special moisture-diffusion barrier, by sputtering or similar means. Substrates of the last type offer the advantage that they can be used to produce curved or flexible display elements, i.e. elements with mechanical properties the like of which cannot readily be obtained with displays based on other principles.

The organic thin layer is advantageously produced by the spinning-on of a solution or dispersion with organic components in a proportion between 0.2 and 10% by weight, preferably between 0.5 and 3%, so that the thickness of the layer ranges from 1 to 50 µm while still wet and is reduced after drying, by means of NIR radiation, to between 10 nm and 1 µm, preferably 50–300 nm. (These ranges are cited as typical values and should by no means be considered restrictive; new findings regarding the mechanisms of action of organic semiconductor structures and electroluminescence arrangements may well alter them.)

The organic composite comprises polymers or small molecules, in particular soluble alkoxyphenyl PPV systems, TAD, MTDATA, Alq$_3$, NPD, DCM, DPVBi, CuPc, OYC and/or rare-earth complexes or other active compounds that endow the thin layer with semiconducting or electroluminescent properties. These substances are temperature-sensitive, so that appropriate limitation of the temperature of the thin layer during processing is essential. NIR treatment is particularly suitable for this purpose because of the very brief time needed for drying as well as the fact that the drying process can be precisely adjusted by controlling the level of irradiation. Ordinarily the thin-layer temperature should be below 100° C.

The auxiliary processes mentioned briefly above, to assist the manufacture of electronic circuits comprising semiconducting organic laminar strucures or display units made of organic layers with electroluminescent properties, comprise in particular the elimination of aqueous adsorbates from the substrate surface (or whatever surface comes into contact with the applied thin layer) by means of brief NIR irradiation.

Another important auxiliary process in the manufacture of such circuits or display elements concerns suitable structuring of the surface area, advantageously by photolithographic means. Here, again, the employment of NIR radiation for drying and/or thermal curing of the photosensitive lacquer is useful.

Production of a multilayered OLED structure is accomplished especially well by the consecutive application, in each case followed by NIR irradiation, of several fluid layers, each of which has a specific organic composition. As such a sequence proceeds, the radiation parameters are adjusted to suit the particular layer being treated. In much the same way, it is also possible to construct circuit structures comprising multiple thin layers of organic semiconductor materials.

Finally, NIR irradiation is also useful for the encapsulation of display and/or electronic circuit elements, which is essential because of the sensitivity of the organic thin layers to moisture; such irradiation enables the adhesives or encapsulation materials (polymers) to be dried and cross-linked in a productive and economical manner.

Particular advantages are provided by NIR irradiation when it is combined with several of the processing steps cited above, because for all of them a single drying installation can be used, a comparatively simple piece of apparatus that requires very little effort to operate.

An apparatus in accordance with the invention that is suitable for implementing the above method, in the various aspects and applications described, comprises a radiation source disposed above the surface of the substrate and directed towards that surface, such that a substantial effective component of its radiation is in the near-infrared region, in particular in the wavelength region between 0.8 and 1.5 μm: specifically, a halogen lamp operated at an elevated temperature (in particular a radiation temperature of more than 2500 K, or more precisely above 2900 K). The radiation source preferably comprises a reflector with a cross section substantially conforming to a section of an ellipse or parabola, to produce a radiation zone that in particular is substantially rectangular, in which the substrate with the fluid thin layer is situated, or through which it is conveyed, during the drying stage.

The power density with respect to the surface of the organic thin layer is preferably 150 kW/m$^2$ or more, in particular above 500 kW/m$^2$.

By adjusting the size of the radiation zone in accordance with the radiation power of the particular radiator employed, it is possible either to irradiate the entire area of the substrate at once or to sweep across sections thereof in succession, depending on the size of the substrate concerned. In the latter case the radiation device also comprises a movement device to allow the radiation source to sweep over the substrate, or to convey the substrate through the radiation zone. In particular in the case of small substrates, however, such as are designed for miniaturized electronic circuits or relatively small displays, it may be more appropriate to employ a stationary arrangement to irradiate the whole surface simultaneously.

The drying effect of NIR irradiation is advantageously enhanced by passing a stream of gas over the surface of the fluid layer or substrate (in particular substantially parallel thereto), which has a protective function as well as assisting drying. The extremely pure inert gas used for this purpose additionally excludes air and moisture, to which the organic thin layer is extremely sensitive, and thus ensures a high yield.

In a preferred means of carrying out the method, before and/or during the irradiation measurements are made of at least one physical parameter of the fluid layer and/or the substrate, in particular the temperature and/or moisture content and/or reflectivity and/or refractive index, and the result of the measurement is evaluated and used to control the irradiation. For this purpose the irradiation apparatus comprises at least one measurement device to detect at least one physical parameter of the fluid layer, in particular its temperature and/or moisture content and/or reflectivity and/or refractive index. The irradiation can then be adjusted "manually" according to the measured values—in particular when this adjustment mainly involves the preliminary setting of a radiation parameter (or several such parameters) in dependence on a value that has been measured in advance. In a preferred automatic implementation of the method, however, the irradiation-control device comprises at least one control input, by way of which it is connected at least indirectly to a measurement device and receives a measurement signal or evaluation result, so that on the basis of this signal or result an adjustment of the irradiation parameters can take place.

The control of the irradiation parameters comprises in particular a control of the temperature of the radiator (for instance, by way of the applied voltage) and/or of the effective radiation power, for example by changing the distance separating the radiator or reflector from the layer to be treated. An additional useful control possibility consists in partially stopping down and/or filtering the NIR radiation by means of a suitable diaphragm or shutter device, or a band or cut-off filter. In this way components of the overall radiation spectrum, in particular those not desired for certain processing steps, or certain regions of the radiation zone of the lamp-reflector arrangement, can be eliminated.

It should be understood that the above-mentioned auxiliary processes, as in the case of NIR irradiation of the fluid layer to generate the functional organic thin layer, can be adjusted in accordance with measured parameters of the substrate or a photosensitive lacquer layer or an adhesive layer, so as to provide an appropriate control of the irradiation.

Finally, it is also possible to provide a system for regulating the sequence of processing steps described above, which can be useful in particular when there are relatively widely (and in some cases unpredictably) varying external influences, such as substrate properties.

The embodiment of the invention is not restricted to the aspects and processing steps described above, but is likewise possible within the context of the attached claims as well as in accordance with additional aspects and other processing steps associated with the manufacture of organic semiconducting and/or electroluminescent structures.

For instance, instead of the above-mentioned halogen lamps as NIR radiation sources, it is also possible to use diodes that emit light in the NIR range (NIR-LEDs) or laser diodes for the proposed method and in the apparatus in accordance with the invention. Such NIR-LEDs or NIR-laser diodes are then—depending on the specific application—provided individually or in small groups or (preferably) in diode arrays having a shape matched to that of the desired radiation zone. The radiation properties of these elements are such that they do not need to be directly associated with a reflector; however, the use of counter-reflectors, in particular, can be advantageous depending on the absorption properties of the item being produced.

The invention claimed is:

1. Method of manufacturing a semiconducting organic laminated structure, for use in an electronic circuit, in particular a logic and/or memory circuit, wherein a substrate is coated with a solution or dispersion containing a small proportion of an organic composite and having a certain wet-layer thickness, which by drying is converted into an organic thin layer with semiconducting properties that adheres to the substrate and has a dry-layer thickness substantially less than the wet-layer thickness, in particular by an order of magnitude or more,
characterized in that the drying is accomplished by brief irradiation with electromagnetic radiation that has its main effective component in the near-infrared range, in particular in the region between 0.8 and 1.5 µm.

2. Method of manufacturing a semiconducting organic laminated structure, for use in a display element of the OLED type, wherein a substrate is coated with a solution or dispersion containing a small proportion of an organic composite and having a certain wet-layer thickness, which by drying is converted into an organic thin layer with electroluminescent properties that adheres to the substrate and has a dry-layer thickness substantially less than the wet-layer thickness, in particular by an order of magnitude or more,
characterized in that the drying is accomplished by brief irradiation with electromagnetic radiation that has its main effective component in the near-infrared range, in particular in the region between 0.8 and 1.5 µm.

3. Method according to claim 1 or 2, characterized in that the solution or dispersion is created with an organic solvent that very readily becomes volatile under the influence of electromagnetic radiation in the near-infrared range, in particular with toluol.

4. Method according to one of the preceding claims, characterized in that the substrate employed is a thin ceramic plate or a thin, in particular flexible glass plate or a plastic film coated with a barrier to the diffusion of moisture.

5. Method according to claim 1, characterized in that the applied solution or dispersion is such that the proportion of the organic composite is between 0.2 and 10% by weight, preferably between 0.5 and 3%, the wet-layer thickness is in the range between 1 and 50 µmn and after drying the dry-layer thickness is in the range between 10 nm and 1 µm, preferably between 50 nm and 300 nm.

6. Method according to claim 1, characterized in that the organic composite comprises polymers or small molecules, in particular a soluble alkoxyphenyl-PPV System, TAD, MTDATA, $Alq_3$, NPD, DCM, DPVBi, CuPc, OXD and/or rare-earth complexes.

7. Method according to claim 1, characterized by adjustment of the irradiation parameters, in particular the energy density and/or duration of irradiation , such that the temperature in the fluid layer is substantially below 100° C.

8. Method of manufacturing a semiconducting and/or electroluminescent organic laminated structure on a substrate, in particular according to claim 1, characterized in that the surface of the substrate, prior to the application of a solution or dispersion containing a small proportion of an organic composite, is freed from aqueous adsorbates by brief irradiation with electromagnetic radiation having its main effective component in the near-infrared range, in particular in the region between 0.8 and 1.5 µm.

9. Method of manufacturing a semiconducting and/or electroluminescent organic laminated structure on a substrate, in particular according to claim 1, characterized in that the surface of the substrate, prior to the application of a solution or dispersion containing a small proportion of an organic composite, is pre-structured by photolithographic means, such that a drying and/or heat-curing of the photosensitive lacquer is achieved by brief irradiation with electromagnetic radiation having its main effective component in the near-infrared range, in particular in the region between 0.8 and 1.5 µm.

10. Method of manufacturing a semiconducting and/or electroluminescent organic laminated structure on a substrate, in particular according to claim 1, characterized in that the organic laminated structure comprises several thin organic layers and the drying of the individual thin organic layers is brought about in a stepwise manner, by sequential brief irradiation with electromagnetic radiation having its main effective component in the near-infrared range, in particular in the region between 0.8 and 1.5 µm.

11. Method of manufacturing a semiconducting and/or electroluminescent organic laminated structure on a substrate, in particular according to claim 1, characterized in that the organic laminated structure is encapsulated immediately after drying, to exclude all moisture, in a process such that drying and/or thermal cross-linking of an adhesive material used for the encapsulation is brought about by brief irradiation with electromagnetic radiation having us main effective component in the near-infrared range, in particular in the region between 0.8 and 1.5 µm.

12. Method according to claim 1, characterized in that the electromagnetic radiation employed is the radiation of a halogen lamp operated at elevated operating temperature, in particular with a radiator temperature of more than 2500 K, specifically more than 2900 K.

13. Method according to claim 1, characterized in that a stream of protective and drying gas is passed over the fluid layer, or over the substrate surface, in particular being directed substantially parallel thereto.

14. Method accounting to claim 1, characterized by an irradiation with radiation focused on a substantially rectangular radiation zone, the width of which si substantially smaller than the associated dimension of the substrate, such that the radiation zone is guided so as to sweep across the substrate, or the substrate is conveyed through the radiation zone.

15. Method according to claim 1, characterized in that before and/or during the irradiation at least one physical parameter of the fluid layer and/or of the substrate, in particular its temperature and/or moisture content and/or reflectivity and/or index of refraction, is measured and the result of the measurement is evaluated and used to control the irradiation.

16. Method according to claim 15, characterized by an implementation of the method with a closed control circuit.

17. Method according to claim 1, characterized in that the power density measured at the surface of the organic thin layer is equal to or above 150 kW/m$^2$, in particular above 500 Kw/m$^2$.

18. Apparatus for implementing the method according to claim 1, characterized by a source of electromagnetic radiation disposed above and aimed at the surface of the substrate, the main effective component of this radiation being in the near region, in particular in the wavelength range between 0.8 µm and 1.5 µm.

19. Apparatus according to claim 18, characterized in that the radiation source comprises a halogen lamp operated at an elevated operating temperature.

20. Apparatus according to claim 18, characterized in that the radiation source has a reflector with substantially the cross-sectional configuration of a section of an ellipse or parabola, to generate a substantially rectangular radiation zone, and is provided with a movement device to produce a sweeping movement of the radiation source over the substrate or to convey the substrate through the radiation zone.

21. Apparatus according to claim 18, characterized by a gas-stream generating device to produce a stream of protective and drying gas, in particular with an inert gas, that is in particular directed substantially parallel to the surface of the semiconductor wafer and hence to the photosensitive lacquer layer.

22. Apparatus according to claim 18, characterized by an irradiation control device comprising in particular a shutter device, to ensure a brief duration of the action of the electromagnetic radiation on the fluid layer, with predetermined, in particular constant, irradiation parameters, specifically a predetermined spectral composition and power density of the radiation.

23. Apparatus according to claim 18, characterized by at least one measurement device to detect at least one physical parameter of the fluid layer, in particular its temperature and/or moisture content and/or refractive index.

24. Apparatus according to claim 22, characterized in that the irradiation control device comprises at least one control input, by way of which it is connected at least indirectly to a measurement device and receives a measurement signal or evaluation result, so that on the basis of the measurement signal or evaluation result an adjustment of the radiation parameters is accomplished.

25. Apparatus according to claim 22, characterized by a regulation device that allows the irradiation to be done within a closed control circuit.

26. Apparatus according to claim 18, characterized in that as radiation source there is provided at least one LED or laser diode emitting in the near infrared, in particular an arrangement of several LEDs or laser diodes prespecified in dependence on the desired form of a radiation zone.

* * * * *